United States Patent [19]

Fazekas

[11] Patent Number: 4,642,566
[45] Date of Patent: Feb. 10, 1987

[54] METHOD FOR THE REGISTRATION AND REPRESENTATION OF SIGNALS IN THE INTERIOR OF INTEGRATED CIRCUITS BY CONSIDERING EDGE STEEPNESS AND APPARATUS FOR IMPLEMENTING THE METHOD

[75] Inventor: Peter Fazekas, Munich, Fed. Rep. of Germany

[73] Assignee: Siemens Aktiengesellschaft, Berlin and Munich, Fed. Rep. of Germany

[21] Appl. No.: 632,473

[22] Filed: Jul. 19, 1984

[30] Foreign Application Priority Data

Sep. 23, 1983 [DE] Fed. Rep. of Germany ....... 3334534

[51] Int. Cl.⁴ .................... G01R 31/28; G01R 31/26
[52] U.S. Cl. ............................ 324/158 R; 324/73 R
[58] Field of Search ............ 324/73 R, 158 R, 77 A, 324/158 D, 71.3; 371/27, 28; 250/310, 311

[56] References Cited

U.S. PATENT DOCUMENTS

| 3,359,491 | 12/1967 | McCutcheon ............... 324/158 R |
| 4,045,736 | 8/1977 | Carpenter et al. ............ 324/158 R |
| 4,277,679 | 7/1981 | Feuerbaum ..................... 250/310 |

OTHER PUBLICATIONS

Feuerbaum, H. P.; "VLSI Testing Using the Electron Probe"; Scanning Electron Microscopy; 1979; vol. 1; pp. 285–296;
Fazekas P., et al., "Scanning Electron Beam Probes VLSI Chips", Electronics, Jul. 14, 1981, pp. 105–112.

*Primary Examiner*—Ernest F. Karlsen
*Attorney, Agent, or Firm*—Hill, Van Santen, Steadman & Simpson

[57] ABSTRACT

A respective threshold circuit is provided for defining upper and lower thresholds representing logic levels of signals occuring within integrated circuits. The chronological position of a signal edge and the steepness of the signal edge are defined with the assistance of the two thresholds.

4 Claims, 2 Drawing Figures

METHOD FOR THE REGISTRATION AND REPRESENTATION OF SIGNALS IN THE INTERIOR OF INTEGRATED CIRCUITS BY CONSIDERING EDGE STEEPNESS AND APPARATUS FOR IMPLEMENTING THE METHOD

BACKGROUND OF THE INVENTION

1. Field of the Invention

The present invention relates to a method and apparatus for registering and representing signals within integrated circuits, in which the signals have two logic levels.

2. Description of the Prior Art

In the internal testing of digital integrated circuits, the chronological position and the steepness of the signal edges must be identified first and foremost.

The foregoing is possible by quantitative signal curve measurement, for example with the assistance of electron beam mensuration technology, but is very time-intensive. The status changes in the internal testing of digital integrated circuits are, in fact, quickly acquired with logic analysis. circuits.

SUMMARY OF THE INVENTION

The object of the present invention is to provide a method and an apparatus with which signals within digital circuits can be very quickly acquired such that the chronological position and the steepness of signal edges can also be identified.

The above object is achieved, according to the invention, for signals have two logic levels in that a respective threshold is defined for each logic level and the chronological position of a signal edge and the steepness of the signal edge are determined with the assistance of the logic levels. More specifically, the two logic levels are employed for reproducing a time diagram of a registered signal, whereby the transitions between the two logic levels are indicated by slanting lines in accordance with the measured edge steepness.

A probe, for example a pulse electron beam or a laser scanner, is directed to a measuring point within a digital integrated circuit and releases particles, for example secondary electrons, which supply information regarding the potential curve at this measuring point. How a potential curve can be sampled with the assistance of an electron probe is disclosed, for example, in U.S. Pat. Ser. No. 4,277,679, fully incorporated herein by this reference. In contrast to logic analysis, a lower threshold and an upper threshold for the registered signal curve are taken into consideration given the method of the present invention. Since only a single threshold is taken into consideration in the known method of logic analysis, a digital signal can only be represented given the known method such that it either assumes the status "0" or the status "1". There are only abrupt changes between the states "0" and "1" in representation of a digital signal which had been picked up with the assistance of the known method of logic analysis. Since there is an upper threshold and a lower threshold for the signal registration given the method of the present invention, there are regions in the reproduction of a digital signal picked up according to the invention where the reproduced signal assumes the value "0" and there are regions where the digital signal assumes the value "1". In addition, there are also regions where the digital signal picked up with the assistance of the method of the invention assumes neither the value "0" nor the value "1", but where this digital signal is in transition either from the value "0" to the value "1" or from the value "1" to the value "0". Since a digital signal is reproduced as a function of time upon reproduction, a narrow transition region between two different logic levels represents a steep edge rise or, respectively, edge decay and a broad transition between two different logic levels represents a relatively flat edge rise or, respectively, edge decay. The two thresholds that are employed in the method can be matched to the logic family to be investigated in a manner similar to that by which the single threshold employed in the known method of logic analysis can be matched to the logic family to be investigated in that method.

Since only a single threshold is employed in the known method of logic analysis, only the two possibilities that a signal value either lies above or below this threshold exists given a known method. With the method of the present invention having an upper threshold and a lower threshold, there are three possibilities, namely, first, that the signal value is above the upper threshold, second that the signal value is between the lower and upper thresholds, and, third, that the signal value is below the lower threshold. When the signal value is located between the lower and upper thresholds, then there is a transition region between the lower logic level and the upper logic level.

The measuring speed in the method of the present invention can be increased in that the sampling of the signal at an internal point of the digital circuit occurs first in rough steps or with a broad sampling pulse until a transition region between upper and lower thresholds, i.e. a signal edge, is perceived. The position of this signal edge and its steepness can be precisely determined by fine scanning or sampling in the environment of this transition region between the upper and lower thresholds, i.e. in the environment of the signal edge. The result of this determination can be stored in a relatively compressed form such as, for example, one datum as to whether the signal edge is rising or decaying, one datum with respect to the chronological position of the signal edge, and a further datum with respect to the steepness of the signal edge.

A representation similar to a logic diagram representation is recommendable for the reproduction of a digital signal registered with the present invention. Only the logic levels "0" and "1" are represented given such a reproduction of a digital signal acquired with the present invention. The status transitions are specified by slanting lines corresponding to the measured edge steepness.

The control of a measured value pick-up preferably occurs with a programmed jog sequencer, for example with a microcomputer system.

The method of the present invention can be utilized not only to pick up digital signals at points within digital circuits, but also to pick up digital signals at outputs of digital circuits.

BRIEF DESCRIPTION OF THE DRAWINGS

Other objects, features and advantages of the invention, its organization, construction and operation will be best understood from the following detailed description, taken in conjunctign with the accompanying drawing, on which.

DESCRIPTION OF THE PREFERRED EMBODIMENTS

Figure 1:
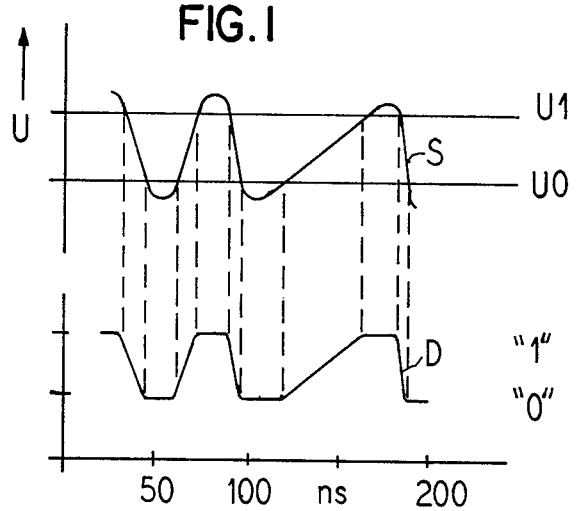
FIG. 1 is a graphic illustration of the underlying principle of the present invention.

FIG. 1 explains the underlying principle of the invention. The upper portion of FIG. 1 illustrates a signal S existing at a measuring point and its assignment to the two thresholds, namely a lower threshold U0 and an upper threshold U1. The measured signal D acquired from the signal S existing at the measuring point is illustrated in the lower portion of FIG. 1. Both of the signals S and D are specified as functions of time t. The voltage values U of the signal S existing at the measured point are therefore illustrated as a function of time t. First, the signal S has a voltage U that is higher than threshold U1. The digital measured signal D therefore initially assumes the logical value "1". The signal S then descends with a relatively steep edge below the threshold U0. The signal D therefore first shows a steep signal decay in order to then assume the logical value "0". After a further relatively steep rise at the signal S beyond the upper threshold U1 and again a steep edge decay of the signal below the value U0, a relatively flat signal rise again beyond the upper threshold U1 and, finally, a relatively steep signal decay below the lower threshold then occur. The signal D reflects this up and down change of the signal S in a simplified form, whereby, in contrast to the known art, however, the signal D does not only assume the logical value "0" or the logical value "1", but also reproduces the position and the steepness of the leading edges and trailing edges of the signal S present at the measuring point in transition regions between these two logical values. An evaluation of the dynamic properties of the circuit portions is thus enabled.

Figure 2:
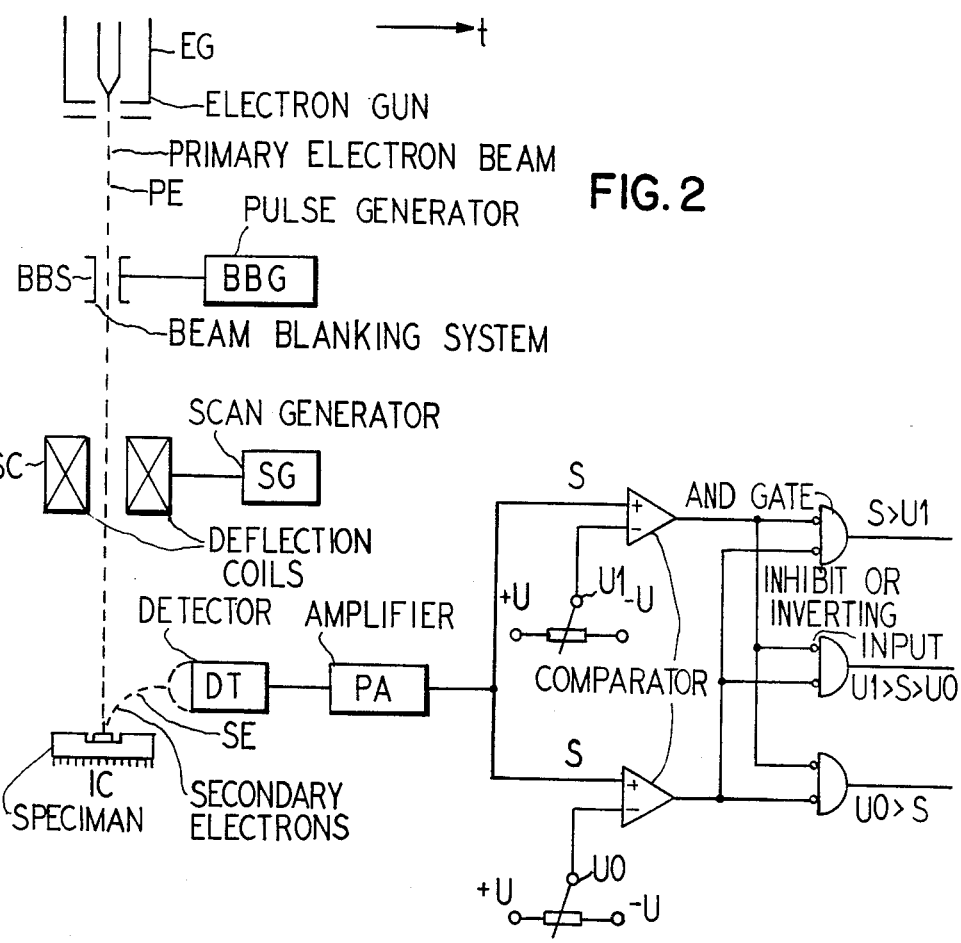
FIG. 2 illustrates, in schematic form, an apparatus for setting thresholds and reading transgressions thereof connected to an electron beam probe system.

FIG. 2 illustrates, on the left, an electron probe system of the type set forth in the aforementioned U.S. Pat. No. 4,277,679. The probe system comprises an electron gun EG for generating a primary electron beam PE which impinges on a specimen IC by way of a beam blanking system BBS connected to a pulse generator BBG and deflection coils SC connected to a scan generator SG. The primary electron beam PE causes the emission of secondary electrons SE from the specimen IC which are detected by a detector DT and amplified by an amplifier PA to produce an output signal S.

FIG. 2 also illustrates an apparatus for setting thresholds, in particular two thresholds. The apparatus for the determination of a threshold essentially comprises a comparator whose inverting input can be set as a reference voltage for upper threshold U1 or, respectively, for a lower threshold U0. The signal S is respectively applied to the non-inverting input of such a comparator. Since an apparatus for the implementation of the method of the invention requires an upper threshold U1 and a lower threshold U0, two comparators are therefore provided for the apparatus to implement the method, the signal S taken at the measuring point being respectively applied to the non-inverting inputs thereof. A voltage corresponding to the upper threshold U1 is applied as a reference voltage to the inverting input of the apparatus for the determination of the upper threshold U1. A voltage corresponding to the lower threshold U0 is applied as a reference voltage to the inverting input of the apparatus for the determination of the lower threshold U0. A logical "1" occurs at the output of the apparatus for fixing the upper threshold U1 when the value of the signal S is greater than the upper threshold U1 and a logical "0" appears when the value of the signal S is lower than the upper threshold U1. A logical "1" occurs at the output of the apparatus for the determination of the lower threshold U0 when the value of the signal S is greater than the lower threshold U0 and a logical "0" appears when the value of the signal S is lower than the threshold U0. When both outputs of the two comparators are combined in an AND gate, then a logical "1" occurs as the output of the AND gate when the value of the signal S is greater than the upper threshold U1. When the inverted output of the circuit for determining the upper threshold U1 is combined in an AND gate with the output of the circuit fixing the lower threshold U0, then a logical "1" occurs at the output of this AND gate when the value of the signal S is greater than the lower threshold U0 and lower than the upper threshold U1. When the inverted outputs of the two circuits for fixing the upper and lower thresholds are combined in an AND gate, then a logical "1" occurs at the output of this AND gate when the value of the signal S is lower than the lower threshold U0.

Although I have described my invention by reference to a particular embodiment thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A method for registering signals at integrated circuits, the signals having logic levels, comprising the steps of:
    defining upper and lower thresholds for the logic levels 1 and 0, respectively, and setting respective thresholds at respective input circuits for the logic level;
    positioning a pulsed primary beam to a measuring location of the integrated circuit to generate secondary particles;
    detecting the secondary particles and generating a corresponding signal to be registered;
    applying the signal to be registered to the two input circuits to detect and provide position signals indicating the chronological positions of signal edges at the logic levels by comparing the signal to the thresholds and producing a logical 1 at times in which the signal is greater than the upper threshold and the logical 0 at times when the signal is smaller than the lower threshold, and determining the signal edges from the chronological spacing of successive signal regions having logical levels 0 and 1, whereby the chronological position of the signal edges is defined by the times at which the signal is equal to the thresholds.

2. The method of claim 1, and further defined by the steps of:
    sampling the input signals at a first rate to determine the edge positions; and
    sampling the input signals at a second, higher rate in the areas of the edges to determine the edge steepness.

3. The method of claim 2, and further comprising the step of:

storing the measured result in a highly-compressed form.

4. Apparatus for registering signals S at integrated circuits, the signals having two logic levels, comprising:
- a pulsed primary beam and means for positioning the beam to a measuring location of an integrated circuit to trigger the emission of secondary particles;
- detection means for detecting the secondary particles and producing a corresponding signal S;
- first and second comparators each including first and second inputs and an output, said first inputs connected to said detection means and serving for receiving the signals S to be registered;
- first and second adjustable reference means connected to respective ones of said second inputs for setting respective first and second thresholds U1, U0 for said comparators; and
- logic means connected to said outputs of said comparators, said logic means including first, second and third outputs and operable to provide a first output signal at said first output when said input signal S is greater than the first threshold U1, a second output signal at said second output when said input signal S is between the first threshold U1 and the second threshold U0, and a third output signal when said input signal S is less than said second threshold U0, said logic means including first, second and third AND gates, said first AND gate including a first input connected to said output of said first comparator and a second input connected to said output of said second comparator, said second AND gate including an inverting first input connected to said output of said first comparator and a second input connected to said output of said second comparator and said third AND gate including an inverting first input connected to said output of said first comparator and an inverting second input connected to said output of said second comparator.

* * * * *